United States Patent [19]
Cutsogeorge

[11] 3,993,958
[45] Nov. 23, 1976

[54] FAST ACQUISITION CIRCUIT FOR A PHASE LOCKED LOOP

[75] Inventor: George Athan Cutsogeorge, Franklin Township, Somerset County, N.J.

[73] Assignee: RCA Corporation, New York, N.Y.

[22] Filed: Aug. 20, 1975

[21] Appl. No.: 606,292

[52] U.S. Cl. .............................. 328/109; 307/232; 331/15
[51] Int. Cl.² ......................................... A03K 5/20
[58] Field of Search ............... 331/17, 15; 328/109, 328/155; 307/232, 295

[56] References Cited
UNITED STATES PATENTS

| | | | |
|---|---|---|---|
| 2,617,037 | 11/1952 | Hugenholtz | 331/17 X |
| 3,262,114 | 7/1966 | LaPorte | 331/17 |
| 3,316,497 | 4/1967 | Brooks | 331/17 |
| 3,363,194 | 1/1968 | Hileman | 331/17 |
| 3,522,549 | 8/1970 | Bancroft | 331/17 |
| 3,805,183 | 4/1974 | Lance | 331/17 X |

*Primary Examiner*—Stanley D. Miller, Jr.
*Assistant Examiner*—B. P. Davis
*Attorney, Agent, or Firm*—Edward J. Norton; Joseph D. Lazar; Michael A. Lechter

[57] ABSTRACT

A circuit for speeding acquisition in a phase and frequency locked loop utilizing a plurality of R–C circuits having differing time constants, interconnected with diodes.

2 Claims, 1 Drawing Figure

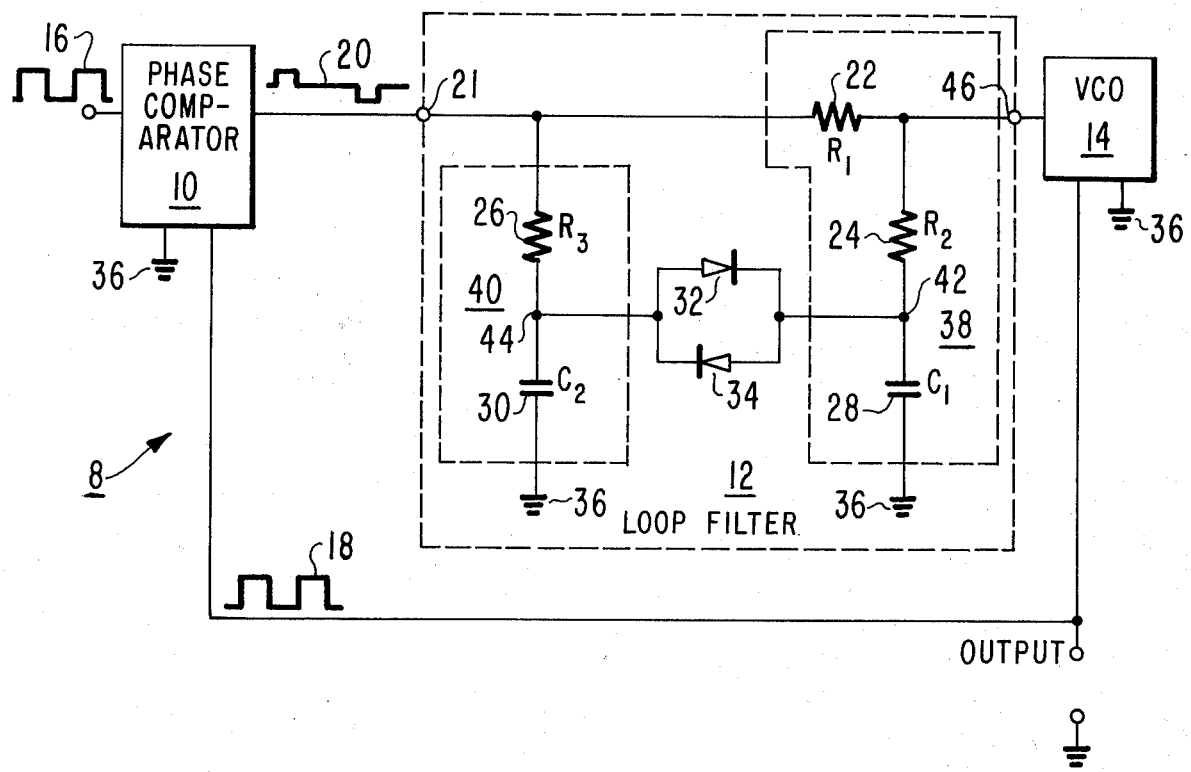

FAST ACQUISITION CIRCUIT FOR A PHASE LOCKED LOOP

BACKGROUND OF THE INVENTION

1. Field of the Invention

The present invention relates to a loop filter circuit for providing fast acquisition in a phase locked loop (PLL) utilizing a phase detector which generates voltage spikes during the locked state of PLL operation.

2. Description of the Prior Art

A phase locked loop (PLL) is a feedback system typically comprising, a phase detector or phase comparator, a "loop filter," and a voltage controlled oscillator (VCO). The loop filter typically comprises a low pass filter. The VCO output signal is applied to one input terminal of the phase comparator, the other input terminal of the phase comparator being receptive of an input reference signal. The phase comparator generates an error signal, indicative of phase differences between the VCO output signal and the reference signal. The error signal is applied to the loop filter, the output signals of the loop filter being, in turn, applied to the control input of the VCO. Thus, the feedback of the error signal causes the oscillator frequency to approach more closely and eventually lock onto the phase of the reference input signal.

A phase locked loop has three operational modes or states: a free running state, wherein no reference signal is applied to the phase comparator; a capture or acquisition state wherein the VCO output signal is different from the reference signal and the VCO is in the process of continually changing output signal phase until the VCO output signal maintains the same phase as the reference signal; and a locked state wherein the VCO output signal tracks and varies exactly with the phase of the reference signal.

For a more detailed description of phase locked loop circuits and operation, reference is made to "Phase Lock Techniques" by Floyd Gardner, N.Y., Wiley and Sons, 1966.

The transfer function of a phase locked loop is defined as the phase of the VCO signal divided by the phase of the reference signal, and is determined, to a large extent, by the transfer function of the loop filter. Accordingly, the "loop bandwidth," defined as the 3 db frequency range of the loop transfer function, is also primarily controlled by the parameters of the loop filter.

An engineering dilemma arises with respect to the loop bandwidth in that, in many applications of PLL's, the criteria for the loop bandwidth is different for the various modes of operation. For example, in some instances, the loop bandwidth should be made as narrow as possible to minimize phase jitter in the VCO output signal, such phase jitter being caused by external noise present in the reference signal, and yet the loop bandwidth should be made as wide as possible to maintain good tracking and acquisition properties.

For example, such an engineering dilemma rises when a phase locked loop is utilized to perform the function of a band pass filter. Computer aided ranging systems often utilize phase locked loops in such a manner. It is desirable in such systems, in order to conserve computer time, that the PLL acquire a signal as quickly as possible. Accordingly, during the acquisition mode of operation, the time constant of the PLL loop filter must be as short as possible and the bandwidth, therefore, as wide, as possible. However, for the PLL to perform properly the function of a bandpass fiter, a predetermined loop bandwidth, typically less than that desirable during the acquisition mode, must be maintained during the locked state.

The approach in the prior art to such loop bandwidth dilemmas has been to utilize a "passive loop filter" comprising first and second resistors and a capacitor, serially connected between the input terminal of the loop filter and ground. Two oppositely poled diodes are connected in parallel across the first resistor. The output signal of the phase comparator is applied to the first resistor and the output of the loop filter is taken across the second resistor and capacitor. During the acquisition mode a differential voltage exists across the diodes and current flows through the diodes. The first resistor is thus bypassed and, in effect, removed from the filter. When phase lock is reached, an equipotential exists across the diodes, and the diodes accordingly become non-conductive. The first resistor is thereby made a factor in determining the time constant of the filter. Thus, during the locked state, the PLL maintains a predetermined narrow bandwidth and, during the acquisition state when the first resistor is not a factor in determining the loop filter time constant, the loop bandwidth is broadened to achieve thus faster acquisition.

The immediately above described "passive loop filter," hereinafter referred to as the "prior art solution loop filter," is not suitable for use in various types of PLL's. For example, it is desirable to have a PLL which locks on frequency as well as phase, and that will not falsely "lock" onto input reference signals that are close to harmonics of the VCO center frequency. Such a PLL is available in integrated circuit form, for example, in a COS/MOS micropower digital integrated circuit, RCA-CD 4046A. The integrated circuit includes a frequency-sensitive phase-comparator, termed an "edge-controlled digital memory network," comprising four flip-flop stages, control logic circuitry and a three-state output circuit. Such a frequency-sensitive phase comparator provides a positive or negative voltage output signal, in accordance with the sense (direction) of frequency displacement of the VCO output signal from the reference signal. Where the frequencies of the VCO output and reference signals are the same, but the signals are out of phase, the phase comparator generates output pulses having a polarity in accordance with the lead or lag of the VCO signal with respect to the reference, the duration or width of the pulses being indicative of the magnitude of the phase difference. The output impedance of the phase comparator during the generation of such output signals is essentially zero. When phase lock between the VCO output and reference signals is achieved the phase comparator produces an output signal at ground potential (typically zero volts) and maintains essentially infinite resistance, i.e. appears as a virtual open circuit.

The loop filter circuit, typically an R-C low pass filter, in effect, integrates the pulses to convert the pulses to a DC signal, i.e., the filter capacitor is charged by the pulses. The D.C. signal is applied to the control terminal of the VCO to adjust thereby the VCO output frequency. When both the frequency and phase of the VCO output and reference signals are the same, the essentially infinite output resistance of the phase comparator maintains the voltage on the filter capacitor at the "equilibrium" value. For a more detailed description of such a phase comparator, reference is made to the data sheet for the aforementioned RCA-CD 4046A, which may be found at file No. 637 of the "RCA Solid State Databook" on COS/MOS Digital Integrated Circuits.

It is noted, however, that the output impedance of the comparator is not actually infinite and that a small leakage current exists, causing a slight decay of the capacitor voltage. Further, small leakages exist at the VCO input terminal and in the capacitor itself. Such leakage current causes a slight variation of the VCO output signal from the reference signal. Accordingly, during the locked state, the comparator continually generates spurious bipolar impulse-like voltage spikes.

The above described prior art solution loop filter is not suitable for use in a PLL utilizing a comparator, such as described above, which generates voltage spikes during the locked state of operation. The diode arrangement of the prior art solution loop filter would couple the voltage spikes directly to the VCO. Such coupling is undesirable in that the voltage spikes would cause modulation of the VCO output signal, which would appear as phase jitter, occurring at a rate equal to the reference frequency, on the VCO output signal. Where the VCO output signal is at the same frequency as the reference signal, the effect of such phase jitter would be an undesirable distortion of the VCO output signal waveform.

SUMMARY OF THE INVENTION

The present invention is directed to a loop filter for a phase locked loop (PLL) utilizing a frequency sensitive phase comparator such as described above, which generates spurious voltage spikes during the locked mode of PLL operation. The loop filter comprises: a first filter means for providing a predetermined loop bandwidth during the locked mode of operation; second filter means for filtering the spurious voltage spikes to ground during the locked mode of PLL operation; and interconnecting means for electrically coupling said first and second filter means only during the acquisition mode of PLL operation thereby to alter the loop bandwidth during the acquisition mode of PLL operation.

BRIEF DESCRIPTION OF THE DRAWING

The sole FIGURE of the drawing is a schematic diagram of a phase lock loop in accordance with the present invention.

DESCRIPTION OF THE PREFERRED EMBODIMENT

The drawing shows a frequency-sensitive phase lock loop 8 in accordance with the present invention, comprising a frequency-sensitive phase comparator 10, such as described above, a loop filter 12 and a VCO 14. Phase comparator 10 and VCO 14 are commercially available in a single integrated package, such as in the above described RCA-CD4064A. A reference input signal 16 is applied to one input of phase comparator 10, the other input of phase comparator 10 being receptive of the VCO output signal 18.

Reference input signal 16 and VCO output signal 18 are typically square wave signals. As noted above, the output signal 20 of phase comparator 10 is applied to an input terminal 21 of loop filter 12. Loop filter 12 comprises first, second and third resistors, 22, 24 and 26, respectively having values $R_1$, $R_2$ and $R_3$. Loop filter 12 further comprises first and second capacitors 28 and 30, respectively having values $C_1$ and $C_2$, and a pair of diodes 32 and 34. Diodes 32 and 34 are suitably silicon type diodes, for example, 1N914 diodes. Resistors 22 and 24 and capacitor 28 are serially-connected between input terminal 21 and ground 36, to form what may be termed a first low-pass filter 38. Resistor 26 and capacitor 30 are similarly serially-connected between input terminal 21 and ground 36 to form what may be termed a second low pass filter 40. Diodes 32 and 34 are connected in parallel, in an oppositely poled manner, between juncture 42 between resistor 24 and capacitor 28, and juncture 44 between resistor 26 and capacitor 30. Juncture 46 between resistors 22 and 24 is utilized as the output terminal of loop filter 12 and is accordingly connected to the control input of VCO 14.

The values of the respective resistors 22, 24 and 26 and the capacitors 28 and 30 are chosen such that the time constant of first low pass filter 38 is much greater than the time constant of second low pass filter 40. The first low pass filter 38 thus has a much narrower bandwidth than the bandwidth of the second low pass filter 40. The time constant of first low pass filter 38 is determined by the sum of the resistances of resistors 22 and 24 multiplied by the capacitance of capacitor 28. Similarly, the time constant of second low pass filter is determined by the resistance of resistor 26 multiplied by the capacitance of capacitor 30.

Loop filter 12 has been implemented wherein the values $R_1$, $R_2$ and $R_3$ of resistors 22, 24 and 26 are respectively 100, 1 and 10 k-ohms, and the capacitances $C_1$ and $C_2$ of capacitors 28 and 30 are each 40 microfarads. Such an implementation of loop filter 12 will hereinafter be referred to as the "exemplary loop filter."

In the operation of PLL 8, loop filter 12 operates to provide a first bandwidth, $BW_{acq}$, during the acquisition mode of PLL operation and a second bandwidth, $BW_L$, during the locked state of operation.

In the operation of phase locked loop (PLL) 8 during the acquisition mode, both first and second low pass filters 38 and 40 are factors in determining the bandwidth of loop filter 12. As noted above, during the acquisition mode of PLL operation the output signals 20 of phase comparator 10 comprise positive or negative voltage levels until the frequencies of reference input signal 16 and VCO output signal 18 are the same. Thereafter, until phase lock occurs, phase comparator ouput signal 20 comprises positive or negative pulses having pulse widths corresponding to the magnitude of the instantaneous phase difference between signals 16 and 18. The different time constants of first and second low pass filters 38 and 40 cause capacitors 28 and 30 to be charged at different rates. Accordingly, a voltage differential exists between junctures 42 and 44 during the acquisition mode. Thus, current flows through diodes 32 and 34, electrically interconnecting low pass filters 38 and 40. Second low pass filter 40 thus must be considered in determining the bandwidth of loop filter 12 during the acquisition mode of PLL operation. The bandwidth of loop filter 12 during the acquisition mode ($BW_{acq}$) may thus be expressed:

$$BW_{acq} = \frac{1}{2\pi \left[\frac{(R_1 + R_2)R_3}{R_1 + R_2 + R_3}\right][C_1 + C_2]} \quad (1)$$

In the above described exemplary loop filter $BW_{acq}$ equals 0.22 Hz. Thus, during the acquisition mode, the voltage on capacitor 28 varies rapidly toward the equilibrium voltage required to establish the control signal to VCO 14 which will maintain phase lock between signals 16 and 18.

Conversely, during the locked mode of PLL operation, the bandwidth of loop filter 12 is essentially determined by the bandwidth of first low pass filter 38. As noted above, once the phase lock loop 8 enters into a locked state, the output impedance of phase comparator 10 becomes essentially infinite, and the voltage on capacitors 28 and 30 are essentially the same. A voltage differential, thus, no longer exists between junctures 42 and 44 and no current flows through diodes 32 and 34. First and second low pass filters 38 and 40 are thus, in effect, isolated during the locked state. During the locked mode of PLL operation loop filter 12 is quiescent except in response to pulses generated by phase comparator 10 in tracking reference signal 16 and the aforementioned spurious voltage spikes. Accordingly, during the locked mode of PLL operation, the bandwidth of loop filter 12 is only relevant with respect to the generation of such pulses. As noted above, during the generation of output pulses the output resistance of phase comparator 10 is low, and is small with respect to both $R_1$ and $R_3$. Since the voltages across capacitors 28 and 30 are equal during the locked mode of PLL operation, low pass filter 40 has virtually no effect on the loop filter bandwidth. Thus, during the locked state of PLL operation, the loop filter bandwidth ($BW_L$) may be expressed:

$$BW_L = \frac{1}{2\pi(R_1 + R_2)C_1} \quad (2)$$

In the above-described exemplary loop filter $BW_L$ equals 0.039 Hz.

As noted above, during the locked state of operation of PLL 8, phase comparator 10 generates spurious, large amplitude, bipolar impulse-like voltage spikes, the rejection of such voltage spikes being unprovided for in prior art loop filters. In accordance with one aspect of the present invention, second low pass filter 40, while in effect isolated from the feedback loop between VCO 14 and phase comparator 10 such that it does not affect $BW_L$, filters out such voltage spikes, thus providing pulse rejection for the VCO. Thus, undesired modulation of VCO 14 output signal 18 caused by such voltage spikes is eliminated.

It should be appreciated from the foregoing description that the present invention provides a particularly advantageous loop filter for a PLL utilizing a phase comparator which generates voltage spikes during the locked state of operation. The loop filter provides for fast acquisition of signals during the acquisition mode, while at the same time maintaining a predetermined bandwidth during the locked state of operation, and, further, isolates the PLL VCO from the above-mentioned voltage spikes by filtering the voltage spikes to ground. This is accomplished by utilizing a plurality of R-C filters interconnected by diodes.

What is claimed is:

1. In a phase locked loop (PLL) of the type having an acquisition mode and a locked mode of operation and including a phase comparator, a loop filter and a voltage controlled oscillator (VCO); said phase comparator being responsive to a reference signal and an output signal of sand VCO, and generating an output signal indicative of phase and frequency differences between said reference signal and VCO output signal; said loop filter being responsive to said phase comparator output signals and providing a control signal for said VCO; said phase comparator generating spurious voltage spikes during said locked mode of PLL operation; said loop filter comprising:

first filter means responsive to said phase comparator output signal for providing said PLL with a first predetermined bandwidth during said locked mode of PLL operation;

second filter means, responsive to said phase comparator output signal, for filtering said voltage spikes to ground during said locked mode of operation; and interconnecting means, coupled between said first and second filter means, for electrically interconnecting said first and second filter means only during said acquisition mode of PLL operation, to provide thereby said PLL with a second predetermined bandwidth during acquisition mode of PLL operation; the improvement wherein:

said first filter means comprises first and second resistors and said first capacitor, each having two terminals, said first resistor being connected at one terminal to said input terminal and the other terminal to one terminal of said second resistor, the other terminal of said second resistor being connected to one terminal of said first capacitor, the other terminal of said first capacitor being connected to a ground; said connection between said first and second resistors being further connected to said VCO to provide said control signal, and said second filter means comprises a third resistor and said second capacitor, each having two terminals, said resistor being connected at one terminal to said input terminal and at the other terminal to one terminal of said second capacitor, the other terminal of said second capacitor being connected to said ground; and wherein further said interconnection means comprises a pair of oppositely-poled diodes, connected in parallel between said connection between said second resistor and said first capacitor, and said connection between said third resistor and said second capacitor.

2. The loop filter of claim 1 wherein the resistances of said first, second and third resistors are respectively 100 $k\Omega$, 1 $k\Omega$, and 10 $k\Omega$ and the capacitances of said first and second capacitors are both 40 $\mu f$.

* * * * *